(12) United States Patent
Sung et al.

(10) Patent No.: US 9,876,169 B2
(45) Date of Patent: Jan. 23, 2018

(54) RRAM DEVICES AND METHODS

(71) Applicant: Taiwan Semiconductor Manufacturing Co., Ltd., Hsin-Chu (TW)

(72) Inventors: Fu-Ting Sung, Yangmei (TW); Chung-Yen Chou, Hsinchu (TW); Shih-Chang Liu, Kaohsiung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/737,830

(22) Filed: Jun. 12, 2015

(65) Prior Publication Data
US 2016/0365512 A1    Dec. 15, 2016

(51) Int. Cl.
*H01L 45/00*    (2006.01)
*H01L 27/24*    (2006.01)

(52) U.S. Cl.
CPC ........ *H01L 45/146* (2013.01); *H01L 27/2436* (2013.01); *H01L 45/1233* (2013.01); *H01L 45/1253* (2013.01); *H01L 45/147* (2013.01); *H01L 45/16* (2013.01); *H01L 45/1675* (2013.01)

(58) Field of Classification Search
CPC .................... H01L 45/1253; H01L 45/146
See application file for complete search history.

(56) References Cited

U.S. PATENT DOCUMENTS

| 8,872,149 | B1 * | 10/2014 | Hsieh | ...................... H01L 45/04 257/2 |
| 2014/0264222 | A1 * | 9/2014 | Yang | ................. H01L 29/66659 257/2 |
| 2015/0171324 | A1 * | 6/2015 | Mikawa | .............. H01L 27/1021 257/4 |

* cited by examiner

*Primary Examiner* — Trang Tran
(74) *Attorney, Agent, or Firm* — Eschweiler & Potashnik, LLC

(57) ABSTRACT

The present disclosure relates to integrated circuits having a resistive random access memory (RRAM) cell, and associated methods of forming such RRAM cells. In some embodiments, the RRAM cell includes a bottom electrode and a top electrode which are separated from one another by an RRAM dielectric. A bottom electrode sidewall and a top electrode sidewall are vertically aligned to one another, and an RRAM dielectric sidewall is recessed back from the bottom electrode sidewall and the top electrode sidewall.

20 Claims, 8 Drawing Sheets

RRAM DEVICES AND METHODS

BACKGROUND

Many modern electronic devices contain electronic memory configured to store data. Electronic memory may be volatile memory or non-volatile memory. Volatile memory stores data only while it is powered, while non-volatile memory is able to retain data when power is removed. Resistive random access memory (RRAM) is one promising candidate for next generation non-volatile memory due to its simple structure and compatibility with CMOS logic. An RRAM cell includes a dielectric data storage layer having a variable resistance. The resistance level of the dielectric data storage layer can be reversibly switched between different resistive states, each of which corresponds to a different data state, thereby allowing RRAM cells to store digital data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 11A-11B illustrate cross-sectional views of some embodiments showing manufacturing processes of a method of forming an integrated circuit device including an RRAM cell.

DETAILED DESCRIPTION

Figure 1A:
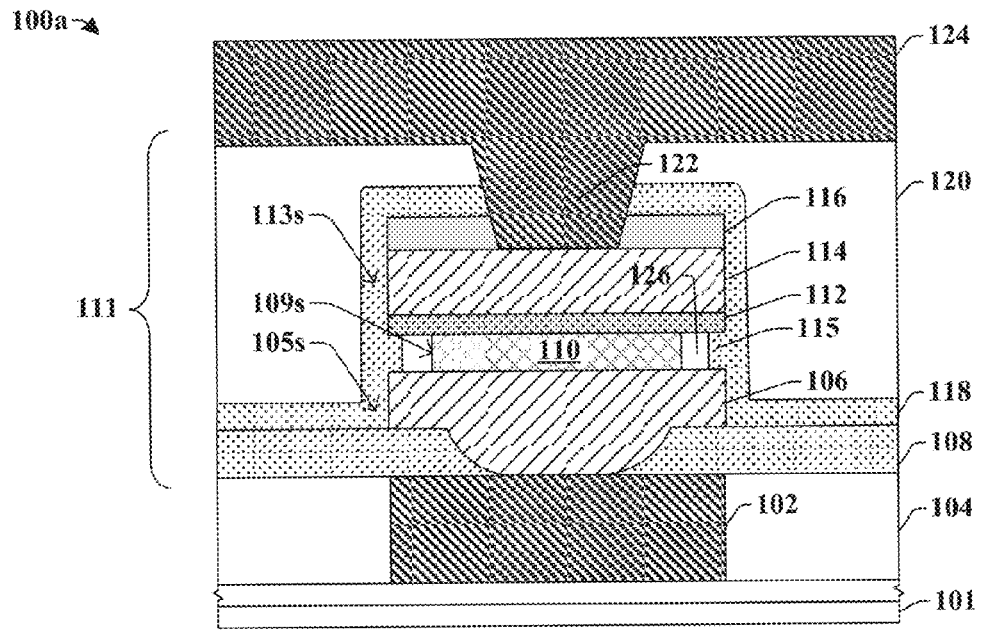
FIGS. 1A-1B illustrates cross-sectional views of some embodiments of an integrated circuit device including an RRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a dielectric data storage layer placed between two electrodes. Depending on voltages applied to the electrodes, the dielectric data storage layer will undergo a reversible change between a high resistance state associated with a first data state (e.g., a '0' or 'RESET') and a low resistance state associated with a second data state (e.g., a '1' or 'SET'). Once a resistance state is set, an RRAM cell will retain the resistive state until another voltage is applied to induce a RESET operation (resulting in a high resistance state) or a SET operation (resulting in a low resistance state).

One performance metric to quantify the performance of an RRAM cell is endurance. The endurance of an RRAM cell is the number of set/reset cycles that can be applied to the RRAM cell before the cell degrades and begins to exhibit excess set/reset failures. The greater the endurance, the better the performance of the RRAM cell. It has been found that after a certain number of set/reset cycles, for example 10,000 set/reset cycles, the quality of some RRAM cells degrades, with increased cycling generally resulting in an increased number of set and/or reset failures. One phenomenon that has been noticed is the 'RESET' state trends to the 'SET' state with increased cycles. In other words, the dielectric data storage layer undesirably and sometimes irreversibly shifts to a low resistance state (e.g., 'SET' state) from a high resistance state (e.g., 'RESET state). One cause of this shift is that the dielectric data storage layer tends to become crystallized over time because the electric-field density gets concentrated at edges of the RRAM cell during SET/RESET operations. Once formed, this crystallized region represents a leakage path through the dielectric data storage layer, which causes this shift to a low-resistance state and reduces the endurance of the RRAM cell over time.

Accordingly, the present disclosure relates to improved RRAM devices and corresponding manufacturing methods which make the applied electrical field more uniform over the dielectric data storage layer. This wards off crystallization and improves the RRAM endurance performance. In some embodiments, the RRAM device comprises an RRAM cell having a top electrode and a bottom electrode, which are separated by an RRAM dielectric having a variable resistance. On either side of the RRAM dielectric, a bottom electrode sidewall and a top electrode sidewall are vertically aligned, such that the electrical field applied to the RRAM dielectric through the aligned electrode pair is uniform in a lateral direction and not concentrated at outer edges of the RRAM dielectric. Further, the outer RRAM dielectric sidewalls are recessed back from the bottom electrode sidewalls and the top electrode sidewalls, providing for further improved electric field uniformity in the RRAM dielectric.

FIG. 1A illustrates a cross-sectional view of an integrated circuit device 100a including an RRAM cell 111 according to some embodiments.

The integrated circuit device 100a is disposed over a substrate 101, and comprises a lower metal interconnect layer 102 surrounded by a lower inter-level dielectric (ILD) layer 104 and an upper metal interconnect layer 124 abutting an upper ILD layer 120. In some embodiments, the lower ILD layer 104 and the upper ILD layer 120 may comprise silicon dioxide ($SiO_2$), a low-x dielectric material, or an extreme low-x (ELK) dielectric material. The RRAM cell 111 is disposed between the lower metal interconnect layer 102 and the upper metal interconnect layer 124 and comprises a bottom electrode 106 electrically coupled to the lower metal interconnect layer 102 and a top electrode 114 electrically coupled to the upper metal interconnect layer 124. The bottom electrode 106 and the top electrode 114 may comprise titanium (Ti), tantalum (Ta), titanium nitride (TiN), tantalum nitride (TaN) or one or more layers of these or other metal composite films. The bottom electrode 106 and the top electrode 114 are separated by an RRAM dielectric 110. A bottom electrode sidewall 105s and a top electrode sidewall 113s are vertically aligned. An RRAM dielectric sidewall 109s is recessed back from the bottom electrode sidewall 105s and the top electrode sidewall 113s. In some embodiments, the RRAM dielectric 110 comprises a material having a variable resistance configured to undergo a reversible phase change between a high resistance state and a low resistance. For example, the RRAM dielectric 110 may include a transitional metal oxide comprising one or more layers of hafnium oxide ($HfO_x$), aluminum oxide ($AlO_x$) tantalum oxide ($TaO_x$), or other composite combinations such as hafnium aluminum oxide (HfAlO).

In some embodiments, a capping layer 112 can be disposed between the RRAM dielectric 110 and the top electrode 114. The capping layer 112 has a lower concentration of oxygen than the RRAM dielectric 110, and is configured to extract oxygen from the RRAM dielectric 110 to facilitate resistance changes within the RRAM dielectric 110. In various embodiments, the capping layer 112 may comprise titanium (Ti), Hafnium (Hf), Platinum (Pt), Ruthenium (Ru) or other composite metal films. A hard mask 116 can be disposed on the top electrode 114. The hard mask 116 has sidewalls vertically aligned with the top electrode sidewall 113s. In some embodiments, a sidewall of the capping layer 112 can also be aligned with the sidewalls of the top electrode 114 and the hard mask 116. In some embodiments, the hard mask 116 may comprise silicon oxy-nitride (SiON), silicon dioxide ($SiO_2$), silicon carbide (SiC), silicon-nitride ($SiN_x$), or other composite dielectric films.

In some embodiments, the RRAM cell 111 further comprises a lower dielectric layer 108 surrounding the bottom electrode 106 and an upper dielectric layer 118 disposed over the lower dielectric layer 108. The upper dielectric layer 118 continuously extends along the bottom electrode sidewall 105s and the top electrode sidewall 113s and overlies the hard mask 116. In some embodiments, the upper dielectric layer 118 further comprises a lateral protrusion 115 that extends inwardly beyond the bottom electrode sidewall 105s and the top electrode sidewall 113s. An air gap 126 separates the lateral protrusion 115 from the RRAM dielectric 110. The air gap 126 is disposed between a lower side of capping layer 112 and an upper surface of the bottom electrode 106 at a peripheral region of the RRAM dielectric 110.

In some embodiments, the upper dielectric layer 118 separates the top electrode 114 and the RRAM dielectric 110 from the upper ILD layer 120 surrounding the upper metal interconnect layer 124. In some embodiments, an upper metal via 122 is disposed through a hole within the upper dielectric layer 118 and connects the top electrode 114 and the upper metal interconnect layer 124. In some embodiments, the lower dielectric layer 108 and the upper dielectric layer 118 may comprise the same dielectric material as one another or different dielectric materials from one another, and may be made up of silicon carbide (SiC), silicon nitride ($SiN_x$), or one or more layers of composite dielectric films, for example.

By arranging the bottom electrode 106 and the top electrode 114 vertically aligned with the same width as each other, an electrical field applied to outer edges of the RRAM dielectric layer 110 during reading and/or writing operations becomes more uniform and electric-field spiking or concentration is reduced or eliminated. Further, because the RRAM dielectric 110 has a smaller width than the bottom and top electrodes (106, 114, respectively), even if there is still some electric field concentration immediately between top and bottom electrode sidewalls 113s, 105s, the fact that the dielectric layer 110 is laterally recessed back from these sidewalls removes the problematic area of conventional dielectric layer where crystallization (and corresponding leakage paths) were formed near this outer edge. Thus, RRAM dielectric 110 is recessed inwardly from the bottom electrode 106 and the top electrode 114, providing an efficient isolation between the two electrodes and at the same time warding off unwanted crystallization and improving endurance of the RRAM device.

Figure 1B:
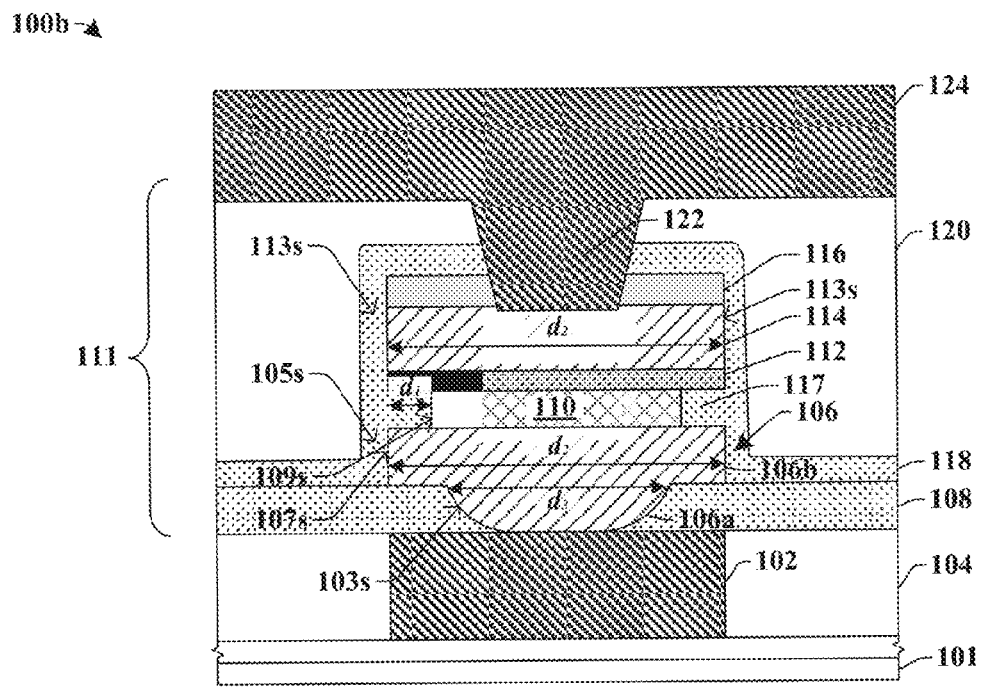

FIG. 1B illustrates a cross-sectional view of another embodiment of an integrated circuit device 100b including an RRAM cell 111 according to some embodiments. In contrast to the integrated circuit device 100a of FIG. 1A, which included air gap 126 along RRAM dielectric sidewall 109s, the integrated circuit device 100b of FIG. 1B has an upper dielectric layer 118 with a lateral protrusion 117 that directly abuts the RRAM dielectric sidewall 109s. Again, because the sidewalls of RRAM dielectric 110 are laterally recessed back from the outermost sidewalls of the bottom and top electrodes (106, 114, respectively), the lateral protrusion 117 is in the region immediately between outermost electrode sidewalls and which is most susceptible to electric-field concentration, and electric field concentration is limited in the outer edges of the laterally recess dielectric layer 110. This reduces the likelihood of crystallization in the dielectric layer 110 and improves endurance of the RRAM device.

As shown in FIG. 1B, in some embodiments a lateral recess distance $d_1$ from the RRAM dielectric sidewall 109s to the top electrode sidewall 113s is greater than 5 nanometers (nm) and less than 50 nm, being between approximately 5 nm and 20 nm in some embodiments. In some embodiments, a ratio of an electrode width $d_2$ to the lateral recess distance $d_1$ from the RRAM dielectric sidewall 109s to the top electrode sidewall 113s is in a range of from about 1:20 to about 1:5.

In some embodiments, the bottom electrode 106 comprises a lower portion 106a and an upper portion 106b. The lower portion 106a is surrounded by a lower dielectric layer 108 and the upper portion 106b is surrounded by an upper dielectric layer 118. The lower portion 106a may have a lower sidewall 103s that is curved or tapered. This lower sidewall curve or taper can be evidenced by an angle, as measured from a bottom surface of the lower dielectric layer 108 to a top surface of the lower dielectric layer 108, which is less than 90°, and more specifically, around 45°. In some embodiments, the lower portion 106a may have a relatively small width $d_3$ compared to a width $d_2$ of the upper portion 106b. The lower portion 106a can act as a via that couples the upper portion 106b to the underlying lower metal interconnect layer 102. The upper portion 106b may have an upper sidewall 107s vertically aligned with the top electrode sidewall 113s and may have a planar upper surface. The upper portion 106b may have the same width $d_2$ as the top electrode 114.

In some embodiments, the bottom electrode 106 may comprise at least two layers of conductive materials. In some embodiments, a diffusion barrier layer (not shown) is disposed between the bottom electrode 106 and the underlying lower metal interconnect layer 102 to prevent contamination and damage to the bottom electrode 106 introduced by diffusion between the lower metal interconnect layer 102 and the bottom electrode 106. Although distances and angles have been set forth with regards to FIG. 1B, it will be appreciated that these distances and angles are not limiting, and that corresponding distances (e.g., widths) and angles are also applicable in a non-limiting manner to the integrated circuit device 100a of FIG. 1A.

Figure 2:
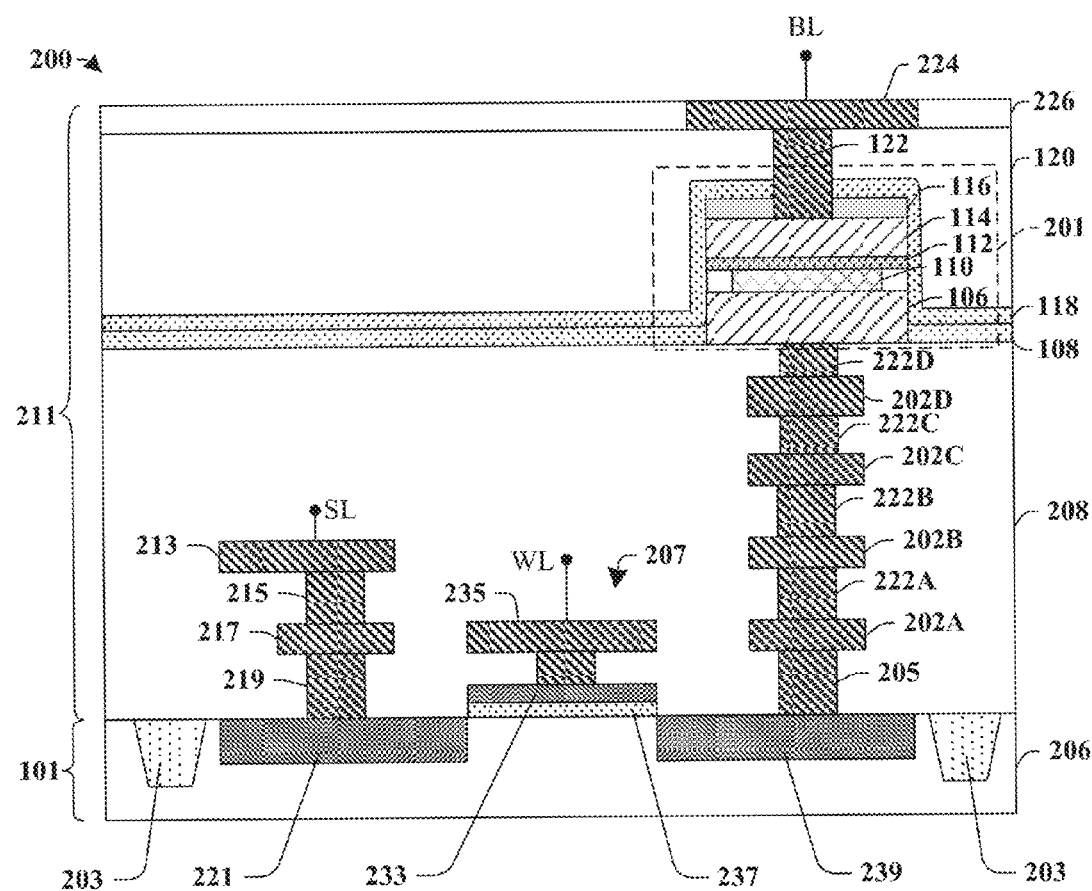
FIG. 2 illustrates a cross-sectional view of some embodiments of an integrated circuit device including a resistive random access memory (RRAM) cell.

FIG. 2 illustrates a cross-sectional view of an integrated circuit device 200 including an RRAM cell 201, such as RRAM cell 111 of FIG. 1A or FIG. 1B, according to some additional embodiments.

As shown in FIG. 2, the RRAM cell 201 can be disposed over a semiconductor substrate 206 on which a transistor i207 s arranged between isolation regions 203. The transistor 207 includes a source region 221, a drain region 239, a gate electrode 233, and a gate dielectric 237. The RRAM cell 201 is arranged in an interconnect structure 211 made up of alternating metal and dielectric layers which are horizontally layered over one another and which are coupled to one another by vias. A source line 213 (SL) for operating the RRAM cell 201 is connected to the source region 221 through a contact 219, a first metal interconnect line 217, and a first metal via 215, which are disposed within one or more ILD layers 208. A word line 235 (WL) for addressing the RRAM cell 201 is formed and electrically coupled to the gate electrode 233. A bottom electrode 106 of the RRAM cell 201 is connected to the drain region 239 through contact 205; first, second, third, and forth metal lines 202A-202D; and metal vias 222A-222D formed between the metal lines 202A-202D. An upper metal via 122 connects a top electrode 114 of the RRAM cell 201 to a bit line corresponding to a fifth metal interconnect layer 224 which is disposed within an ILD layer 226.

Sidewalls of the top electrode 114 and the bottom electrode 106 are vertically aligned and an RRAM dielectric 110 and a capping layer 112 are disposed there between. An RRAM dielectric sidewall is recessed back from the sidewalls of the top electrode 114 and the bottom electrode 106. A lower dielectric layer 108 surrounds the bottom electrode 106 and an upper dielectric layer 118 abuts the lower dielectric layer 108 and covers the RRAM dielectric 110, the capping layer 112 and the top electrode 114. Because the sidewalls of RRAM dielectric 110 are laterally recessed back from the outermost sidewalls of the bottom and top electrodes (106, 114, respectively), electric field concentration is limited in outermost edges of the dielectric layer 110. This reduces the likelihood of crystallization in the RRAM dielectric layer 110 and improves endurance of the RRAM device.

Figure 3:
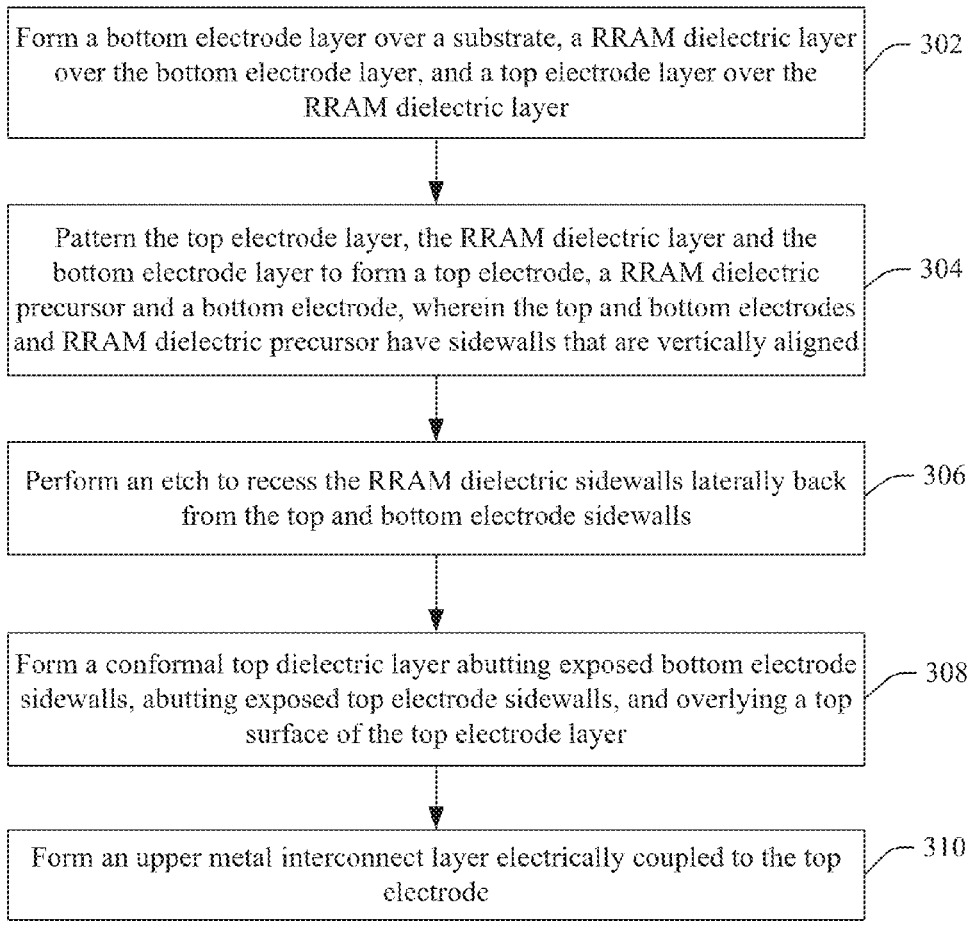
FIG. 3 illustrates a flow diagram of some embodiments of a method of forming an integrated circuit device including an RRAM cell.

FIG. 3 illustrates a flow diagram of some embodiments of a method 300 of forming an integrated circuit device including an RRAM cell.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a bottom electrode layer is formed over a substrate, an RRAM dielectric layer is formed over the bottom electrode layer, and a top electrode layer is formed over the RRAM dielectric layer.

At 304, the top electrode layer, the RRAM dielectric layer, and the bottom electrode layer are patterned to form a top electrode, an RRAM dielectric precursor, and a bottom electrode, respectively. Sidewalls of the top electrode, sidewalls of the RRAM dielectric precursor, and sidewalls of the bottom electrode sidewalls are vertically aligned with one another.

At 306, an etch is performed to laterally recess the RRAM dielectric sidewalls back from the top and bottom electrode sidewalls.

At 308, a conformal top dielectric layer is formed. The conformal top dielectric layer abuts exposed sidewalls of the bottom electrode, abuts exposed sidewalls of the top electrode, and overlies a top surface of the top electrode layer.

At 310, an upper metal interconnect layer is formed electrically coupled to the top electrode.

FIGS. 4 through 11A-11B illustrate a series of cross-sectional views showing methods of forming an integrated circuit device including an RRAM cell in accordance with some embodiments. Although FIGS. 4 through 11A-11B are described in relation to method 300, it will be appreciated that the structures disclosed in FIGS. 4 through 11A-11B are not limited to such a method, but instead may stand alone as structures independent of the method.

FIGS. 4-7 illustrate some embodiments of cross-sectional views 400, 500, 600, 700 corresponding to act 302.

Figure 4:
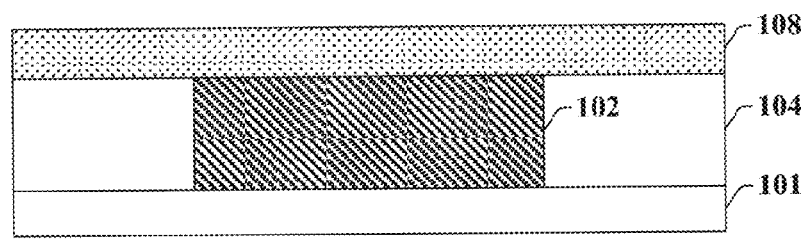

As shown in FIG. 4's cross-sectional view 400, a lower metal interconnect layer 102 is formed within a lower ILD layer 104 overlying a substrate 101. The lower ILD layer 104 can take the form of an oxide, a low-x dielectric, or an extreme low-x dielectric. In some embodiments, the lower metal interconnect layer 102 may be disposed within an interconnect structure, such as previously shown in FIG. 2, which illustrated an example where the lower metal interconnect layer 102 corresponding to the fourth metal layer M4). A lower dielectric layer 108 is formed over the lower metal interconnect layer 102 and the lower ILD layer 104. In some embodiments, the lower dielectric layer 108 may comprise silicon-nitride (SiN), silicon-carbide (SiC), or a similar composite dielectric film. In some embodiments, the lower dielectric layer 108 may be formed by a vapor deposition technique (e.g., physical vapor deposition, chemical vapor deposition, etc.). In some embodiments, the lower metal interconnect layer 102 may be formed by forming a mask (not shown), such as a photoresist mask over the lower ILD layer 104, and etching the lower ILD layer 104 with the mask in place to form an opening in the lower ILD layer 104. A metal (e.g., copper, aluminum, etc.) is then deposited to fill the opening, and a planarization process is performed to remove excess metal to form the lower metal interconnect layer 102.

Figure 5:
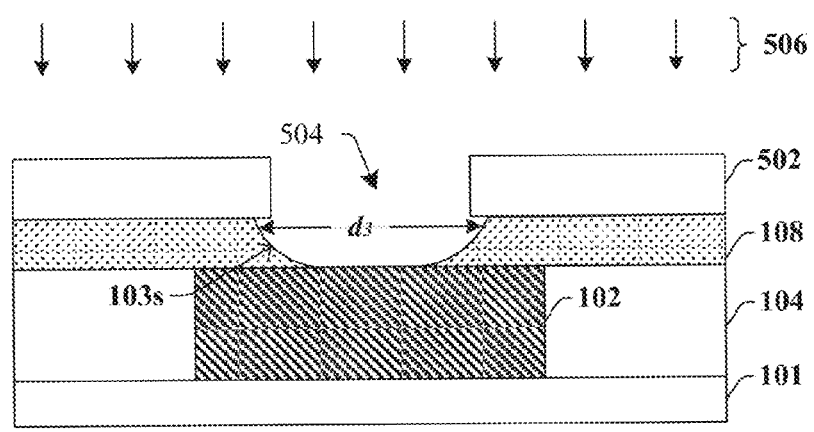

As shown in FIG. 5's cross-sectional view 500, a via opening 504 is formed through the lower dielectric layer 108 at a position overlying the lower metal interconnect layer 102. In some embodiments, a photoresist mask 502 is formed over the lower dielectric layer 108 and has an opening corresponding to the via opening 504 to be formed. Then an etchant 506 is applied to remove an exposed portion of the lower dielectric layer 108. In some embodiments, the via opening 504 can be formed through a dry etch process such as a plasma etching, but in other embodiments a wet etch could be used. By adjusting powers and flow rate of react gases used in plasma etching, sidewalls contours of the via opening 504 can be controlled. In some embodiments, a tapered or rounded sidewall 103s is formed to facilitate subsequent reliable filling of the via opening 504 with a conductive material. As an example, sidewalls of the via opening 504 may exhibit an angle of around 45°, as measured from a bottom surface of the lower dielectric layer 108 to a top surface of the lower dielectric layer 108.

Figure 6:
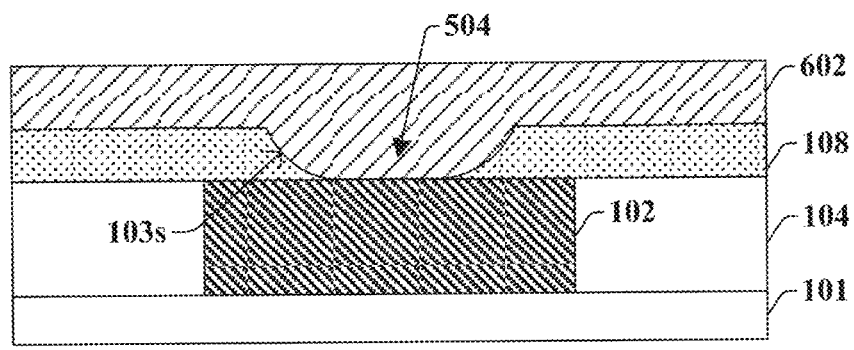

As shown in FIG. 6's cross-sectional view 600, the photoresist mask 502 is removed and a bottom electrode layer 602 is formed within the via opening 504 and extends over the lower dielectric layer 108. Prior to deposition of the bottom electrode layer 602, a diffusion barrier layer (not shown) may optionally be deposited on the lower metal interconnect layer 102 and along the sidewall 103s of the via opening 504 to prevent diffusion between the lower metal interconnect layer 102 and the bottom electrode layer 602. The bottom electrode layer 602 may be formed by depositing one or more conductive layers followed by a planarization process such as chemical-mechanical polishing. In various embodiments, the bottom electrode layer 602 may comprise a metal nitride (e.g., titanium nitride (TiN), tantalum nitride (TaN)), or a metal (e.g., titanium (Ti) or tantalum (Ta)).

Figure 7:
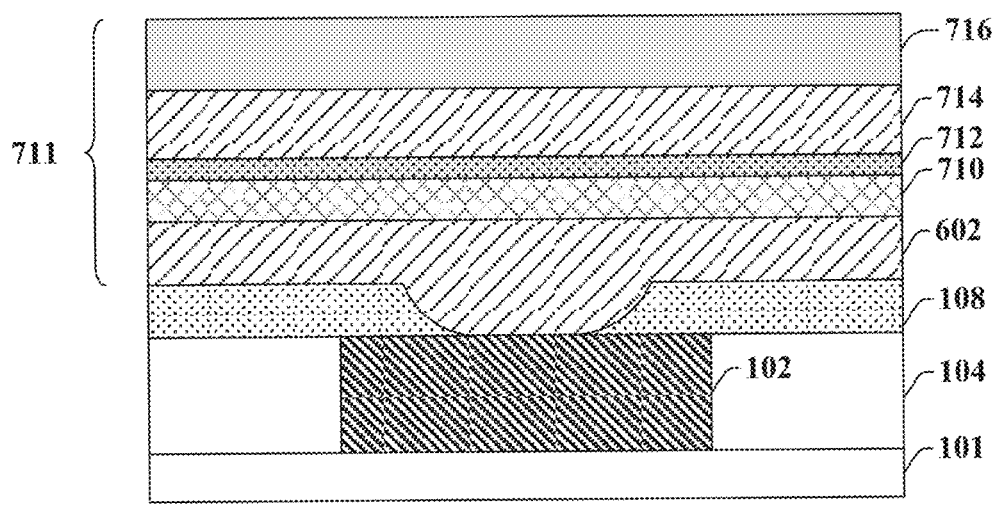

As shown in FIG. 7's cross-sectional view 700, an RRAM dielectric layer 710, an optional capping layer 712, a top electrode layer 714, and a hard mask layer 716 are formed in succession over the bottom electrode layer 602 to form an un-patterned RRAM stack 711.

In some embodiments, the hard mask layer 716 may comprise an oxygen containing dielectric, such as silicon-oxide ($SiO_2$) or silicon-oxynitride (SiON). In other embodiments, the hard mask layer 716 can be substantially devoid of oxygen, such as silicon-nitride (SiN) silicon-carbide (SiC) or a composite dielectric film that is substantially devoid of oxygen. In some embodiments, the RRAM dielectric layer 710 may comprise a high-x dielectric material having a variable resistance. For example, in some embodiments, the level of oxygen in the RRAM dielectric layer 710 may be altered to correspondingly alter the resistive state of the RRAM dielectric layer 710. For example, in the high-resistance state, the dielectric layer 710 may be infused with oxygen to comprise a metal oxide composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$); whereas in the low-resistance state the dielectric layer 710 may be stripped of oxygen to comprise a metal such as titanium (Ti), hafnium (Hf), platinum (Pt), ruthenium (Ru), and/or aluminum (Al). In some embodiments, the optional capping layer 712 may comprise a metal or a metal oxide composite depending on its resistance state; examples are titanium (Ti), hafnium (Hf), zirconium (Zr), germanium (Ge), or cesium (Ce). In some embodiments, the top electrode layer 714 may comprise a metal nitride (e.g., titanium nitride (TiN) or tantalum nitride (TaN)) or a metal (e.g., titanium (Ti) or tantalum (Ta)).

Figure 8:
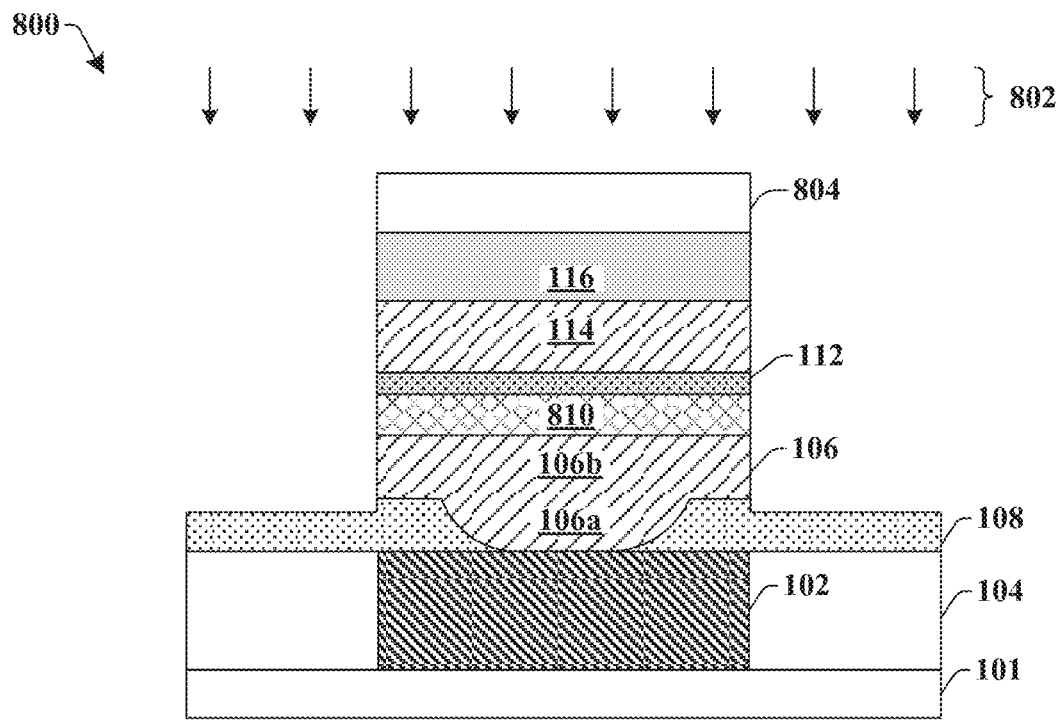

FIG. 8 illustrates some embodiments of a cross-sectional view 800 corresponding to act 304.

As shown in cross-sectional view 800, a photoresist mask 804 is patterned over the structure of FIG. 7, and an etch 802 is carried out with the patterned photoresist mask 804 to provide a hard mask 116 from hard mask layer 716 (as shown in FIG. 7). The etch 802 also etches the top electrode layer 714 (FIG. 7) to provide a top electrode 114, etches the optional capping layer 712 (FIG. 7) to form capping layer 112, etches the RRAM dielectric layer 710 (FIG. 7) to form RRAM dielectric precursor 810, and etches the bottom electrode layer 602 (as shown in FIG. 7) to form a bottom electrode 106, which is made up of upper and lower portions 106b, 106a. The etch 802 may also extend downward into the lower dielectric layer 108. In some embodiments, the etch 802 could comprise a series of dry etching processes that are substantially anisotropic. For example, the etch 802 could comprise plasma etching using chemistry comprising gases of $CF_4$, $CH_2F_2$, $Cl_2$, $BCl_3$ and/or other chemicals. The etch 802 could also comprise sputtering etching using argon (Ar) or other energetic particles.

Figure 9:
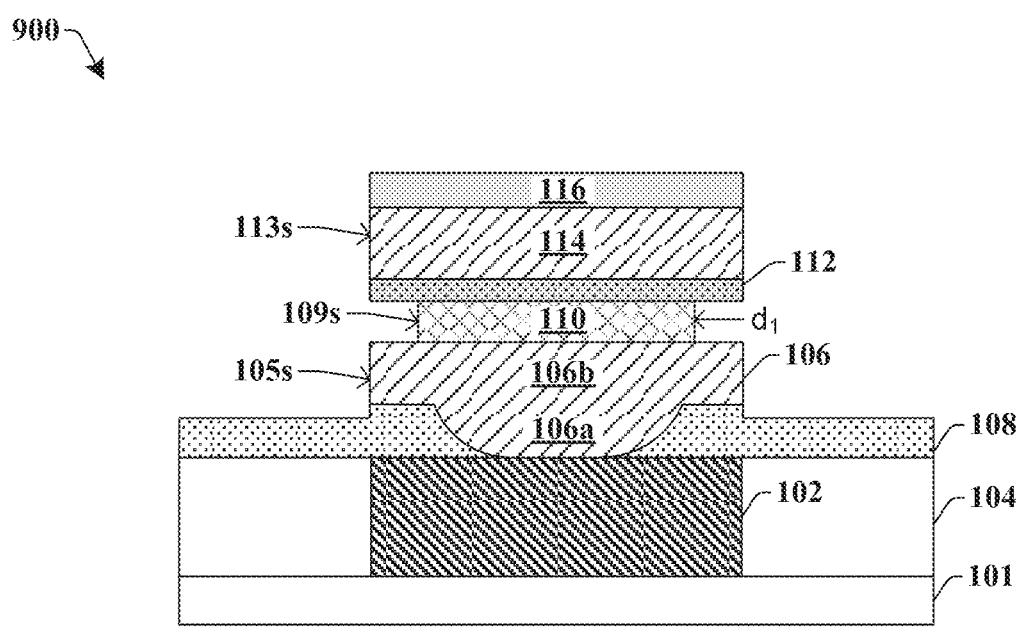

FIG. 9 illustrates some embodiments of a cross-sectional view 900 corresponding to act 306.

As shown in FIG. 9's cross-sectional view 900, an etch is performed to recess an RRAM dielectric sidewall 109s laterally back from the corresponding top and bottom electrode sidewalls 113s, 105s (see arrow $d_1$). In some embodiments, this etch is a wet etch that converts the RRAM dielectric precursor 810 (as shown in FIG. 8) to an RRAM dielectric 110 having an RRAM dielectric sidewall 109s recessed back from the sidewalls of the top electrode 114 and the bottom electrode 106.

Figure 10A:
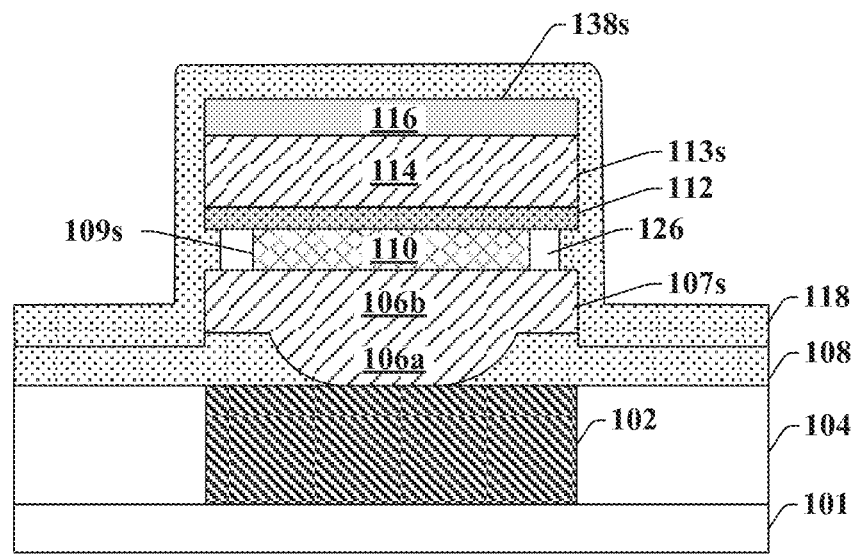
Figure 10B:
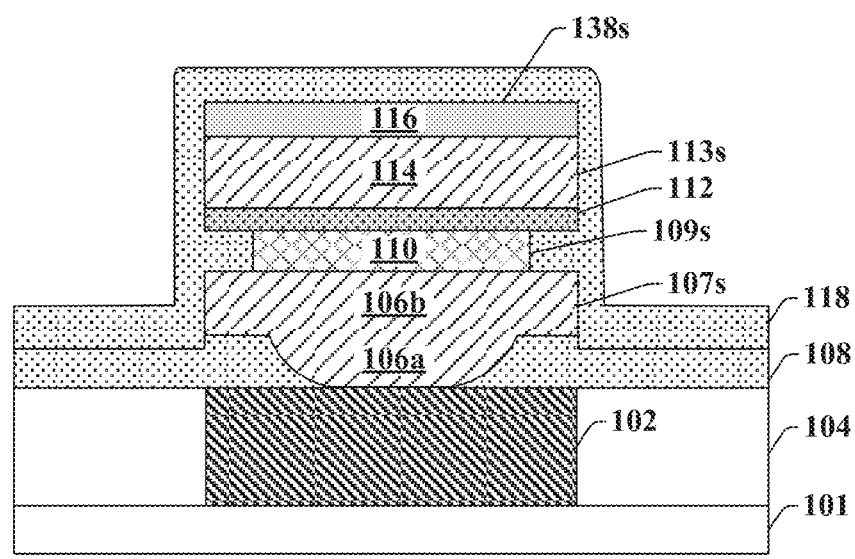

FIGS. 10A-10B illustrate some embodiments of cross-sectional views 1000a, 1000b corresponding to act 308.

As shown in FIG. 10A's cross-sectional view 1000a, a conformal upper dielectric layer 118 is formed to overlie the lower dielectric layer 108 and to extend along an upper sidewall 107s of an upper portion 106b of the bottom electrode, extend inwardly to enclose an air gap 126 adjacent to an RRAM dielectric sidewall 109s, extend along a top electrode sidewall 113s, and overlie an upper surface 138s of the hard mask 116. In some embodiments, the air gap 126 has a low pressure that is the same as that of the processing chamber where the RRAM cell is processed.

Alternatively, as shown in FIG. 10B's cross-sectional view 1000b, a conformal upper dielectric layer 118 is formed to overlie the lower dielectric layer 108 and to extend along an upper sidewall 107s of the upper portion 106b of the bottom electrode, extend inwardly to laterally abut an RRAM dielectric sidewall 109s, extend along a top electrode sidewall 113s, and overlie an upper surface 138s of the hard mask 116. In some embodiments, the conformal upper dielectric layer 118 is formed by atomic layer deposition (ALD).

Figure 11A:
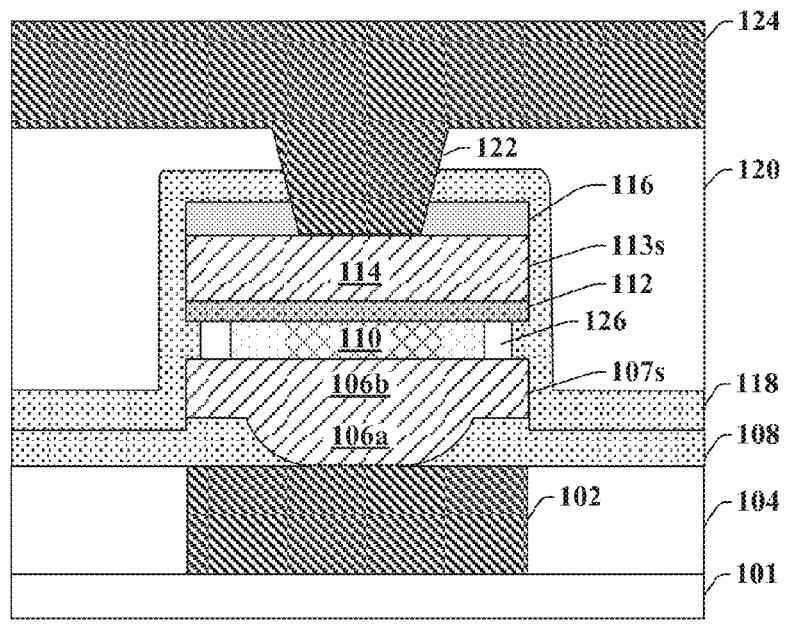
Figure 11B:
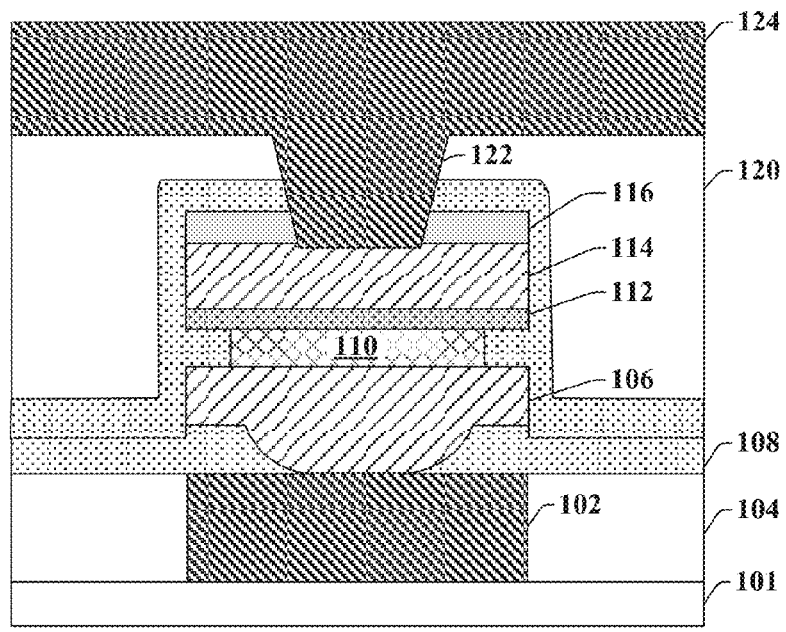

FIGS. 11A-11B illustrate some embodiments of cross-sectional views 1100a, 1100b corresponding to act 310.

As shown in cross-sectional views 1100a and 1100b, an upper metal via 122 and an upper metal interconnect layer 124 are formed over the upper dielectric layer 118 within an upper ILD layer 120. The upper metal via 122 is disposed through the upper dielectric layer 118 and electrically connected to the top electrode 114.

Therefore, the present disclosure relates to an integrated circuits device having an RRAM cell, and an associated method of formation. The RRAM cell of the integrated circuits comprises a bottom electrode and a top electrode separated by an RRAM dielectric. A bottom electrode sidewall and a top electrode sidewall are vertically aligned to one another, such that an electric field applied during the operation of the integrated circuits are laterally uniform. AN RRAM dielectric sidewall is recessed back from the bottom electrode sidewall and the top electrode sidewall to provide efficient isolation. Thus edge concentration of the electric field is eliminated, the crystallization of the RRAM dielectric is deferred and endurance of the RRAM cell is improved.

In some embodiments, the present disclosure relates to integrated circuit device. The integrated circuit device comprises a bottom electrode surrounded by a lower dielectric layer and having a bottom electrode sidewall, an RRAM dielectric having a variable resistance, disposed over the bottom electrode, and a top electrode disposed over the RRAM dielectric and having a top electrode sidewall. The integrated circuit device further comprises an upper dielectric layer disposed over the lower dielectric layer and extending along the bottom electrode and the top electrode. The bottom electrode sidewall and the top electrode sidewall are vertically aligned to one another and an RRAM dielectric sidewall is recessed back from the bottom electrode sidewall and the top electrode sidewall.

In some other embodiments, the present disclosure relates to an integrated circuit device. The integrated circuit device comprises a substrate comprising a transistor with a source region and a drain region and a lower metal interconnect layer disposed over the substrate and electrically coupled to the drain region of the transistor through a series of contacts and vias. The integrated circuit device further comprises a resistive random access memory (RRAM) cell disposed over the lower metal interconnect layer and comprising a bottom electrode having a bottom electrode sidewall, an RRAM dielectric arranged over the bottom electrode having an RRAM dielectric sidewall, and a top electrode arranged over the RRAM dielectric and having a top electrode sidewall. The integrated circuit device further comprises an upper metal interconnect layer disposed over the RRAM cell and electrically coupled to the top electrode of the RRAM cell through a via. The bottom electrode sidewall and the top electrode sidewall are vertically aligned. The RRAM dielectric sidewall is recessed back from the bottom electrode sidewall and the top electrode sidewall.

In yet other embodiments, the present disclosure relates to a method of an integrated circuit device. The method comprises forming a bottom electrode layer over a substrate, an RRAM dielectric layer over the bottom electrode layer, and a top electrode layer over the bottom electrode layer. The method further comprises patterning the top electrode layer, the RRAM dielectric layer and the bottom electrode layer to form a top electrode, an RRAM dielectric precursor and a bottom electrode having sidewalls vertically aligned. The method further comprises performing an etch to laterally recess sidewalls of the RRAM dielectric precursor back from the sidewalls of the top and bottom electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a bottom electrode surrounded by a lower dielectric layer and having a bottom electrode sidewall;
an RRAM dielectric having a variable resistance and disposed over the bottom electrode, the RRAM dielectric having an RRAM dielectric sidewall;
a top electrode disposed over the RRAM dielectric and having a top electrode sidewall;
an upper dielectric layer disposed over the lower dielectric layer and extending along the bottom electrode sidewall and the top electrode sidewall; and
an air gap disposed between the RRAM dielectric sidewall and an inner sidewall of the upper dielectric layer;
wherein the bottom electrode sidewall and the top electrode sidewall are vertically aligned to one another and the RRAM dielectric sidewall is laterally recessed back from the bottom electrode sidewall and the top electrode sidewall;
wherein the upper dielectric layer comprises a lateral protrusion between the bottom electrode and the top electrode that extends inwardly beyond the bottom electrode sidewall and the top electrode sidewall.

2. The integrated circuit device of claim 1, wherein a lateral recess distance from the RRAM dielectric sidewall to the bottom electrode sidewall and the top electrode sidewall is greater than 5 nanometers (nm).

3. The integrated circuit device of claim 1, wherein a ratio of an electrode width of the top or bottom electrode to a lateral recess distance from the RRAM dielectric sidewall to the bottom electrode sidewall or the top electrode sidewall is in a range of from about 1:20 to about 1:5.

4. The integrated circuit device of claim 1, wherein the bottom electrode comprises a lower portion surrounded by the lower dielectric layer and an upper portion surrounded by the upper dielectric layer.

5. The integrated circuit device of claim 1, wherein the bottom electrode comprises a lower portion with a rounded or tapered sidewall.

6. The integrated circuit device of claim 1, wherein the bottom electrode comprises at least two layers of conductive material including titanium(Ti), tantalum (Ta), titanium nitride (TiN), or tantalum nitride (TaN).

7. The integrated circuit device of claim 1, wherein the RRAM dielectric comprises one or more of hafnium aluminum oxide (HfAlO), hafnium oxide (HfO$_x$), aluminum oxide (AlO$_x$), or tantalum oxide (TaO$_x$).

8. The integrated circuit device of claim 1, wherein the upper and lower dielectric layers comprise silicon carbide (SiC).

9. The integrated circuit device of claim 1, further comprising:
a capping layer disposed between the RRAM dielectric and the top electrode, the capping layer having a sidewall vertically aligned with the bottom electrode sidewall and the top electrode sidewall, wherein the capping layer has a lower concentration of oxygen than the RRAM dielectric; and
a hard mask disposed between the top electrode and the upper dielectric layer and having a sidewall vertically aligned with the sidewall of the capping layer.

10. The integrated circuit device of claim 9, wherein the capping layer comprises titanium (Ti), hafnium (Hf), platinum (Pt), or ruthenium (Ru).

11. An integrated circuit device, comprising:
a substrate comprising a transistor with a source region and a drain region;
a lower metal interconnect layer disposed over the substrate and electrically coupled to the drain region of the transistor through a series of contacts and vias;
a resistive random access memory (RRAM) cell disposed over the lower metal interconnect layer and comprising a bottom electrode having a bottom electrode sidewall, an RRAM dielectric arranged over the bottom electrode having an RRAM dielectric sidewall, and a top electrode arranged over the RRAM dielectric and having a top electrode sidewall;
an upper metal interconnect layer disposed over the RRAM cell and electrically coupled to the top electrode of the RRAM cell through a via; and
an air gap disposed between the top and bottom electrodes abutting the RRAM dielectric sidewall;
wherein the bottom electrode sidewall and the top electrode sidewall are vertically aligned;
wherein the RRAM dielectric sidewall is laterally recessed back from the bottom electrode sidewall and the top electrode sidewall.

12. The integrated circuit device of claim 11, wherein the bottom electrode comprises an upper portion with a planar upper surface and a lower portion with a smaller width than the upper portion.

13. The integrated circuit device of claim 12, further comprising:
a lower dielectric layer having a curved sidewall that abuts a corresponding curved sidewall of the lower portion of the bottom electrode; and
an upper dielectric layer disposed over the lower dielectric layer and continuously extending along a sidewall of the upper portion of the bottom electrode and the top electrode sidewall, and overlying the top electrode.

14. The integrated circuit device of claim 13, wherein the air gap separates the RRAM dielectric from the upper dielectric layer.

15. An integrated circuit device, comprising:
a bottom electrode surrounded by a lower dielectric layer and having a bottom electrode sidewall;
an RRAM dielectric having a variable resistance and disposed over the bottom electrode, the RRAM dielectric having an RRAM dielectric sidewall;
a top electrode disposed over the RRAM dielectric and having a top electrode sidewall;
an upper dielectric layer disposed over the lower dielectric layer, extending along the bottom electrode sidewall and the top electrode sidewall, and crossing over a top surface of the top electrode; and
an air gap disposed between the RRAM dielectric sidewall and an inner sidewall of the upper dielectric layer.

16. The integrated circuit device of claim 15, wherein the bottom electrode comprises a lower portion with a rounded or tapered sidewall surrounded by the lower dielectric layer and an upper portion surrounded by the upper dielectric layer.

17. The integrated circuit device of claim 15,
wherein the bottom electrode sidewall and the top electrode sidewall are vertically aligned to one another, and the RRAM dielectric sidewall is laterally recessed back from the bottom electrode sidewall and the top electrode sidewall;
wherein the upper dielectric layer comprises a lateral protrusion that extends inwardly beyond the bottom electrode sidewall and the top electrode sidewall.

18. The integrated circuit device of claim 13, wherein the upper dielectric layer comprises a lateral protrusion that extends inwardly to the RRAM dielectric sidewall.

19. The integrated circuit device of claim 1, wherein the upper dielectric layer comprises a lateral protrusion that extends to the RRAM dielectric sidewall.

20. The integrated circuit device of claim 1, wherein the air gap abuts the RRAM dielectric sidewall.

* * * * *